United States Patent
Kaneko et al.

(10) Patent No.: US 7,994,830 B2
(45) Date of Patent: *Aug. 9, 2011

(54) SYSTEMS AND METHODS FOR PLL LINEARITY MEASUREMENT, PLL OUTPUT DUTY CYCLE MEASUREMENT AND DUTY CYCLE CORRECTION

(75) Inventors: Masaaki Kaneko, Round Rock, TX (US); David W. Boerstler, Round Rock, TX (US); Eskinder Hailu, Sunnyvale, CA (US); Jieming Qi, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/624,630

(22) Filed: Nov. 24, 2009

(65) Prior Publication Data

US 2011/0121874 A1 May 26, 2011

(51) Int. Cl.
*H03L 7/06* (2006.01)
(52) U.S. Cl. ......... 327/157; 327/148
(58) Field of Classification Search ........ 327/148, 327/157

See application file for complete search history.

(56) References Cited

U.S. PATENT DOCUMENTS

| 7,019,572 B2 | 3/2006 | Miki |
| 7,103,337 B2 | 9/2006 | Uozumi |
| 7,642,863 B2 * | 1/2010 | Kaneko et al. ........... 331/44 |

* cited by examiner

*Primary Examiner* — Lincoln Donovan
*Assistant Examiner* — Adam D Houston
(74) *Attorney, Agent, or Firm* — Law Offices of Mark L. Berrier (57) ABSTRACT

Systems and methods for enabling the determination of voltage controlled oscillator (VCO) linearity, duty cycle determination and duty cycle correction in phase locked loop circuits (PLL's.) One embodiment comprises a method including the steps of determining the frequency response of a PLL's VCO as a function of duty cycle, applying a signal based on the VCO output to the VCO input, measuring the resulting frequency of the VCO output signal, determining the duty cycle corresponding to the measured frequency, and configuring a duty cycle correction unit correct the duty cycle of the VCO output signal to about 50%. Determining the frequency response of the VCO may include, for each of several different duty cycle values between 0% and 100%, applying the VCO input signal to the VCO and determining the corresponding frequency of the VCO output signal. This may also be done for duty cycles of 0% and 100%.

4 Claims, 10 Drawing Sheets

(Prior art)
Fig. 1

| TEST[1] | TEST[0] | UP | DN | VC |
|---|---|---|---|---|
| 0 | 0 | Valid | Valid | Normal |
| 0 | 1 | 0 | 1 | Down |
| 1 | 0 | 1 | 0 | Up |

| TEST[1] | TEST[0] | UP | DN | VC |
|---|---|---|---|---|
| 0 | 0 | Valid | Valid | CPO |
| 0 | 1 | 0 | 1 | CPO |
| 1 | 0 | 1 | 0 | CPO |
| 1 | 1 | 0 | 0 | RCLK |

| TEST[2] | TEST[1] | TEST[0] | UP | DN | VC |
|---|---|---|---|---|---|
| 0 | 0 | 0 | Valid | Valid | CPO |
| 0 | 0 | 1 | 0 | 1 | CPO |
| 0 | 1 | 0 | 1 | 0 | CPO |
| 0 | 1 | 1 | 0 | 0 | RCLK |
| 1 | 1 | 1 | 0 | 0 | NCLK |

SYSTEMS AND METHODS FOR PLL LINEARITY MEASUREMENT, PLL OUTPUT DUTY CYCLE MEASUREMENT AND DUTY CYCLE CORRECTION

CROSS-REFERENCE TO RELATED APPLICATIONS

This application claims the benefit of U.S. patent application Ser. No. 11/952,706 by Kaneko et al., filed Dec. 7, 2007, which is incorporated by reference as if set forth herein in its entirety.

BACKGROUND

1. Field of the Invention

The invention relates generally to phase-locked loop (PLL) circuitry, and more particularly to systems and methods for enabling the determination of voltage controlled oscillator (VCO) linearity, duty cycle determination and duty cycle correction in PLLs.

2. Related Art

A PLL is a control circuit that generates and output signal which has a fixed relationship to a reference signal that is input to the PLL. The PLL adjusts an internally generated signal so that this signal matches both the frequency and the phase of the reference signal.

PLLs are widely used in radio, telecommunication, computer and other fields of electronics to generate signals having stable frequencies and known phases with respect to a reference signal. PLLs may be used, for instance, in computer systems to generate clock signals for distribution to digital logic circuits so that these circuits can operate in a synchronized fashion.

In a typical conventional PLL, a control signal (VC) is provided to a VCO, which then generates an output signal having a frequency corresponding to the control signal. The control signal is generated by feeding both the VCO output signal (or a frequency-divided version of this signal) and a reference signal to a phase and frequency detector. The phase and frequency detector detects differences between the reference signal and VCO output signal and generates two control signals (UP and DN) that are provided to a charge pump. Based on the UP and DN control signals, the charge pump generates an output signal that is then low-pass filtered to produce the VCO control signal, VC.

It is useful for circuit designers to be able to test the operation of the PLL in order to determine whether the PLL and the circuitry that operates in dependence on the PLL output signal will operate properly. In particular, it is helpful to be able to test the operation of the VCO. Conventionally, it is only possible to test the minimum and maximum frequencies that can be generated by the VCO. This is typically accomplished by providing a test signal to the phase and frequency detector. The test signal can be set to cause the phase and frequency detector to alternately operate in three modes: normal operation; VCO high frequency test; and VCO low frequency test. In the high-frequency test mode, the phase and frequency detector asserts only the UP control signal to the charge pump, causing it to generate the maximum output voltage, which in turn drives the VCO to generate its maximum output frequency. In the low-frequency test mode, the phase and frequency detector asserts only the DN control signal to the charge pump, causing it to generate its minimum output voltage, which in turn drives the VCO to generate its minimum output frequency.

It would be desirable to be able to test more than just the minimum and maximum output frequencies of the VCO, however. For instance, the frequency response of a VCO typically is not linear, so it would be useful to be able to test the VCO output frequency with respect to several different voltages of the VCO's input control signal, rather than only the minimum and maximum values.

SUMMARY OF THE INVENTION

One or more of the problems outlined above may be solved by the various embodiments of the invention. Broadly speaking, the invention includes systems and methods for systems and methods for enabling the determination of voltage controlled oscillator (VCO) linearity, duty cycle determination and duty cycle correction in PLLs.

One embodiment comprises a method implemented in a phase locked loop (PLL) circuit. The method includes the steps of determining the frequency response of the PLL's voltage controlled oscillator (VCO) as a function of duty cycle, applying a signal based on the VCO output to the VCO input, measuring the resulting frequency of the VCO output signal, determining the duty cycle corresponding to the measured frequency, and configuring a duty cycle correction unit correct the duty cycle of the VCO output signal to about 50%. Determining the frequency response of the VCO may include the steps of, for each of a plurality of different duty cycle values between 0% and 100%, applying the VCO input signal to the VCO and determining the corresponding frequency of the VCO output signal. This may also be done for duty cycles of 0% and 100%.

In an alternative embodiment, a method implemented in a phase locked loop (PLL) circuit includes the steps of controlling the PLL circuit to operate in a test mode, setting an input signal for a voltage controlled oscillator (VCO) to a plurality of voltages between a minimum and a maximum control voltage, for each of the voltages, measuring a corresponding frequency of a VCO output signal, and recording the frequency response of the VCO as a function of voltage of the input signal. The method may also include low-pass filtering the VCO output signal and providing the filtered VCO output signal to the VCO as the input signal, measuring the frequency of the resulting output signal generated by the VCO, and identifying a duty cycle value in the frequency response of the VCO corresponding to the measured frequency. The method may further include configuring a duty cycle correction unit based on the identified duty cycle to correct the duty cycle of the VCO output signal to about 50%. The method may include alternately controlling the PLL circuit to operate in the test mode and a normal operational mode. In the normal operational mode, the PLL circuit is driven to cause a feedback signal derived from the VCO output signal to have the same frequency and phase as a reference signal.

Another alternative embodiment comprises a PLL circuit which includes a voltage controlled oscillator (VCO) and a multiplexer configured to alternately select either a first control signal that varies in dependence on the output of a phase and frequency detector or a user-variable test signal, and provides the selected signal as an input to the VCO. The PLL circuit may include a phase and frequency detector, a charge pump, a low-pass filter and a frequency divider. The phase and frequency detector is configured to detect phase and frequency differences between a reference signal and a feedback signal that varies in dependence upon a VCO output signal. The frequency divider is configured to receive the VCO output signal, divide the frequency of the VCO output signal by a value N, and provide a resulting frequency-divided signal to the phase and frequency detector as the feedback signal. The low-pass filter is configured to filter the selected control signal before the selected control signal is provided as the input to the VCO. The charge pump is configured to receive charge pump control signals from the phase and frequency detector and to produce a charge pump output signal that has a duty cycle which varies according to the charge pump control signals received from the phase and frequency detector. The charge pump output signal is provided to the multiplexer as the first control signal, and the reference signal input to the phase and frequency detector is input to the first multiplexer as the test signal. The PLL circuit may also include a second multiplexer configured to receive a user-variable reference signal and the VCO output signal, to select one of these signals, and to forward the selected signal to the first multiplexer as the test signal. The PLL circuit may also include a duty cycle correction unit configured to receive the VCO output signal and to correct the duty cycle of the VCO output signal to about 50%. The PLL circuit may also include Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for enabling the determination of voltage controlled oscillator (VCO) linearity, which can then be used to determine the duty cycle of the PLL output signal, allowing for correction of the PLL duty cycle.

In one embodiment, a PLL circuit includes a phase and frequency detector, a charge pump, a low-pass filter, a voltage controlled oscillator (VCO,) a frequency divider, and a series of output signal buffers. These components are configured in essentially the same way as the corresponding components of a conventional PLL circuit. The present embodiment, however, includes several additional components that provide the capabilities described above.

A first added component is a multiplexer that is located between the charge pump and the low pass filter. The multiplexer's inputs are the charge pump output and a signal that can be varied by a user. When the multiplexer selects the charge pump output and forwards this signal to the low pass filter, the PLL operates normally. When the multiplexer selects the user-variable signal, this signal can be set to known parameters which, when passed to the low pass filter, produce known inputs to the VCO (besides the minimum and maximum that are possible with the charge pump output.) The linearity of the VCO can be determined by measuring the VCO output as a function of the reference signal (and corresponding VCO input.)

A second added component is another multiplexer. This multiplexer is upstream from the first multiplexer. The second multiplexer accepts as inputs the user-variable signal and the output of the PLL. When the second multiplexer selects the user-variable signal, the linearity of the VCO can be measured. When the second multiplexer selects the PLL output, the duty cycle of the PLL output signal determines the VCO output frequency. Because the linearity of the VCO response is known (or can be determined, the duty cycle of the PLL output can also be determined.

A third added component is a duty cycle correction unit. Once the duty cycle of the PLL output signal is determined using the measured linearity, the duty cycle can be corrected to ensure that it is within acceptable limits (e.g., it is approximately 50%.)

The details of these additional components and the configuration of the inventive PLL circuitry will be discussed in detail below. It will be helpful, however, to first describe the structure of a conventional PLL circuit so that the differences between the conventional circuitry and the inventive circuitry are clear.

Figure 1:
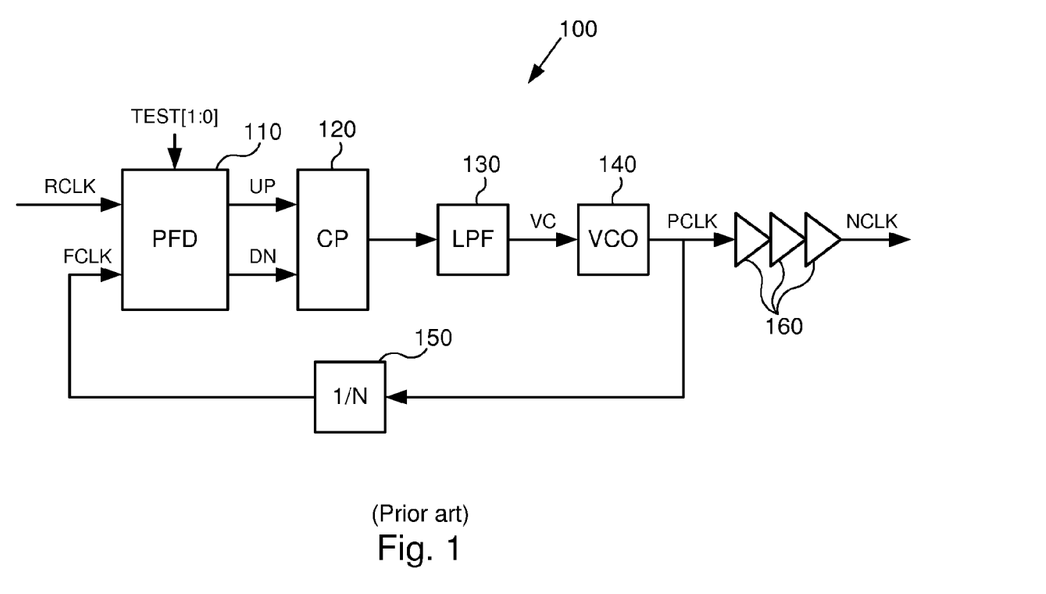
FIG. 1 is a diagram illustrating a PLL circuit in accordance with the prior art.

Referring to FIG. 1, a diagram illustrating a PLL circuit in accordance with the prior art is shown. In this embodiment, PLL circuit 100 includes a phase and frequency detector 110, a charge pump 120, a low-pass filter 130, a voltage controlled oscillator (VCO) 140, a frequency divider 150, and a series of output signal buffers 160. PLL circuit 100 receives a reference signal (RCLK) as an input and generates an output signal (NCLK) as an output. In this embodiment, RCLK and NCLK are clock signals, and the frequency of NCLK is N times the frequency of RCLK.

The reference signal RCLK is input to phase and frequency detector 110, along with a feedback signal which is a frequency-divided version (FCLK) of the signal (PCLK) output by VCO 140. Phase and frequency detector 110 detects differences between RCLK and FCLK and generates control signals UP and DN based on the detected differences. These control signals drive the PLL circuitry to generate the VCO output signal such that FCLK has the same frequency and phase as the reference clock signal.

The UP and DN control signals generated by phase and frequency detector 110 are provided to charge pump 120. Charge pump 120 produces an output signal that is alternately either high or low, depending upon the UP and DN control signals. In this embodiment, the high signal has a voltage of VDD, and the low signal is at ground. This signal produced by charge pump 120 is therefore binary, but does not necessarily have a regular period or frequency.

The signal produced by charge pump 120 is provided to low-pass filter 130. Low-pass filter 130 effectively integrates this signal and produces an output signal which changes very slowly in comparison to the rapidly changing signal output by charge pump 120. The slowly varying signal produced at the output of low-pass filter 130 is then provided to VCO 140 as a control voltage, VC.

VCO 140 generates an oscillating output signal, PCLK. The frequency of PCLK depends upon the voltage of VCO control voltage VC which is received from low-pass filter 130. The higher the voltage of control signal VC, the higher the frequency of output signal PCLK. The lower the voltage of VC, the lower the frequency of PCLK. Output signal PCLK is provided both to a series of buffers 160 and any frequency divider 150. Buffers 160 amplify the signal and provide it at the output of the PLL circuitry as clock signal NCLK. Frequency divider 150 receives signal PCLK, divides the frequency of the signal by N, and provides the resulting clock signal, FCLK, to phase and frequency detector 110.

PLL circuitry 100 therefore operates in the following manner in a normal mode. When the reference signal RCLK is input to phase and frequency detector 110, it is compared to the frequency-divided feedback signal FCLK. The differences between the signals are used to generate control signals UP and DN, which drive charge pump 120. If the frequency of RCLK is greater than the frequency of FCLK, signal UP is asserted for a greater percentage of time than signal DN, causing the output of charge pump 120 to have a higher duty cycle, thereby causing the output of low-pass filter 130 to have a higher voltage. This higher voltage drives VCO 140 to generate a higher-frequency output signal PCLK. On the other hand, if the frequency of RCLK is less than the frequency of FCLK, DN is asserted for a greater percentage of time than UP, causing the output of charge pump 120 to have a lower duty cycle, which reduces the voltage of low-pass filter 130. This lower voltage drives VCO 140 to generate a lower-frequency output signal. PLL circuitry 100 is driven toward, and stabilizes in, a state at which the frequency of RCLK is approximately equal to that of FCLK.

PLL circuitry 100 can also operate in a test mode. In this mode, phase and frequency detector 110 generates predetermined control signals UP and DN. Depending upon the values of the bits in test signal TEST, one of these control signals will be continuously asserted while the other is continuously deasserted. When control signal UP is continuously asserted (and control signal DN is deasserted,) charge pump 120 is driven to produce the maximum voltage at its output. This maximum voltage is passed through low-pass filter 130 essentially unchanged (since it is constant) and is provided to VCO 140. VCO 140 consequently produces an output signal PCLK which has a maximum frequency. If, on the other hand, control signal DN is asserted and UP is deasserted, charge pump 120 is driven to produce the minimum voltage at its output. This voltage is passed through low-pass filter 130 and is provided to VCO 140, which is then driven to produce output signal PLCK at the minimum possible frequency.

Figure 2:
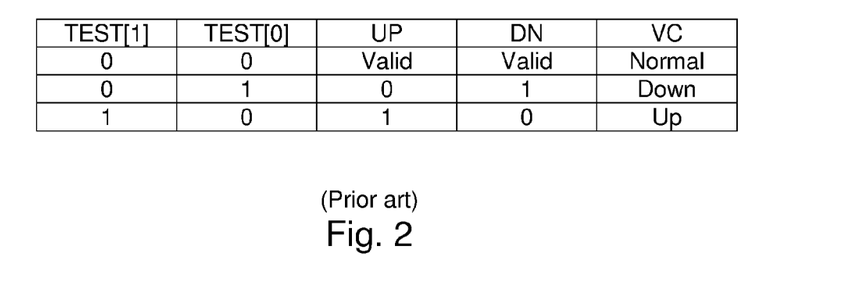
FIG. 2 is a table showing the values of the test signal input to phase and frequency detector, and the resulting control signals UP, DN and VC in the PLL circuitry of FIG. 1.

Referring to FIG. 2, a table showing the values of the test signal input to phase and frequency detector 110, and the resulting control signals UP, DN and VC in the PLL circuitry of FIG. 1 is provided. For the purposes of this disclosure, TEST[1:0] refers to the two-bit signal, while TEST[1] refers to bit 1 of the signal and TEST[0] refers to bit 0 of the signal.

As shown in the table of FIG. 2, when both bits of the TEST signal are 0, phase and frequency detector 110 generates control signals UP and DN which are "valid." In other words, these are valid control signals which are computed to drive in FCLK toward RCLK. These control signals in turn drive charge pump 120 and low-pass filter 130 to generate a VCO control voltage VC which is "normal" (i.e., VC is generated in accordance with normal operation of the PLL circuitry.)

In the test mode, one of the bits of signal TEST will be 1, while the other bit will be 0. If TEST[1] is 0 and TEST[0] is 1 (a first test sub-mode,) phase and frequency detector 110 will continuously assert control signal DN (i.e., DN will be 1,) while control signal UP will be deasserted (i.e., it will be 0.) These control signals will drive charge pump 120 to generate a constant low voltage which will be passed to VCO 140, which will produce PCLK at a minimum frequency. If TEST [1] is 1 and TEST[0] is 0 (a second test sub-mode,) phase and frequency detector 110 will continuously assert control signal UP while the asserting control signal DN. The control signals will then drive charge pump 120 to generate a constant high voltage which will be passed to VCO 140, which will then produce PCLK at the maximum frequency.

Figure 3A:
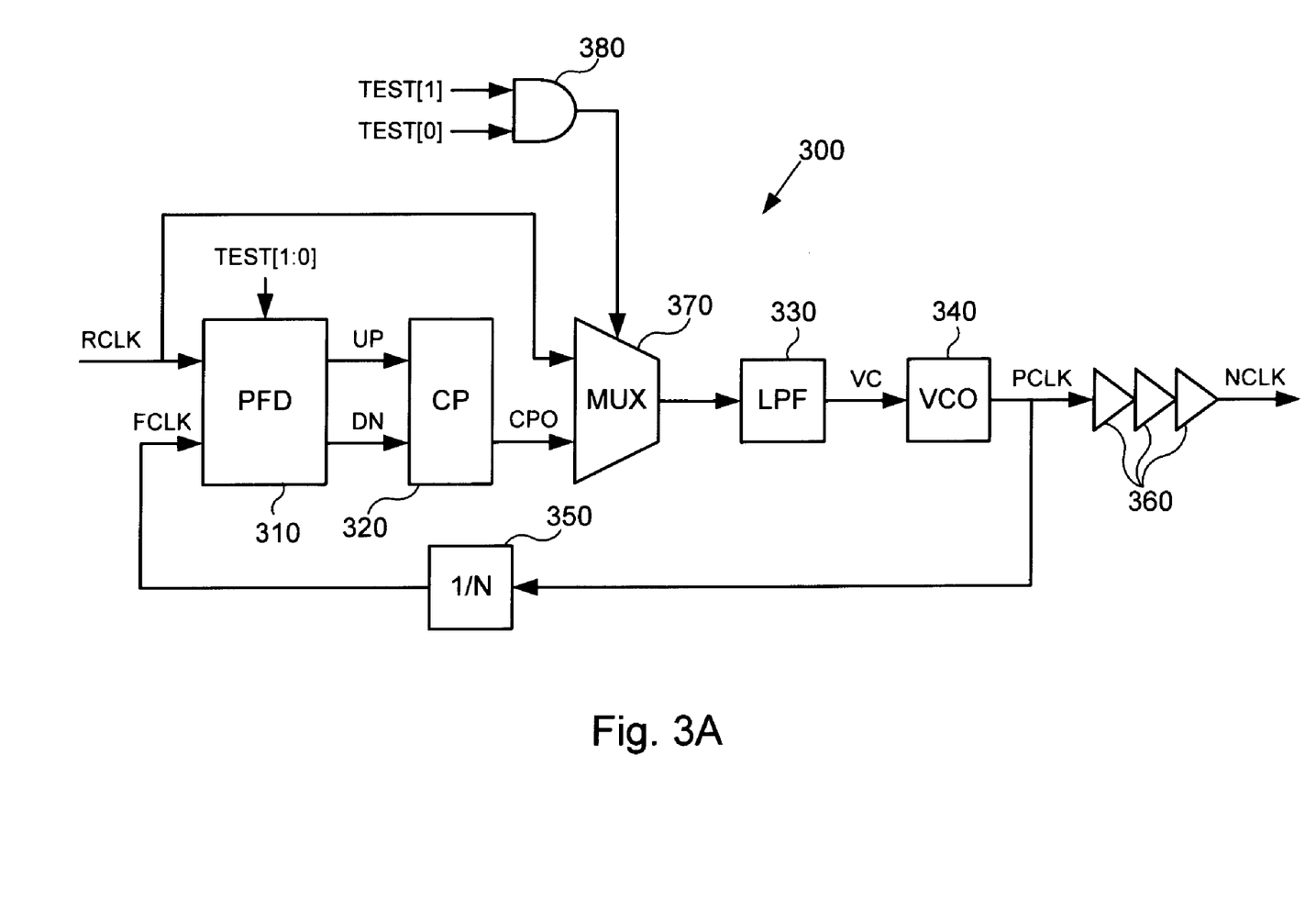
FIGS. 3A and 3B are diagrams illustrating a PLL circuit in accordance with an exemplary embodiment of the invention.

Referring to FIG. 3A, a diagram illustrating a PLL circuit in accordance with an exemplary embodiment of the invention is shown. The basic structure of PLL circuitry 300 is very similar to the structure of conventional PLL circuit 100. PLL circuitry 300 includes a phase and frequency detector 310, charge pump 320, low-pass filter 330, VCO 340, frequency divider 350 and buffers 360. This embodiment also includes a multiplexer 370 and an AND gate 380 to expand the test capabilities of the circuitry.

In the embodiment of FIG. 3A, phase and frequency detector 310 is again configured to detect differences between RCLK and FCLK, and to generate control signals UP and DN in accordance with the detected differences. These control signals drive charge pump 320 to produce a binary charge pump output signal (CPO,) which is provided to low-pass filter 330 in a normal operating mode. The output of low-pass filter 330 is then provided as control voltage VC to VCO 340, causing it to produce output signal PCLK at a corresponding frequency. VCO output signal PCLK is provided to buffers 360, which produce PLL output signal NCLK, and is also provided to frequency divider 350, which divides the frequency of PCLK by N and provides the resulting signal to phase and frequency detector 310 as FCLK.

As noted above, the output of charge pump 320 is passed to low-pass filter 330 in a normal operating mode. In this normal operating mode, the bits of signal TEST are both 0. The output of AND gate 380 (which is provided to multiplexer 370 as a control input) is therefore 0, causing multiplexer 370 to select the charge pump output (CPO) to be passed to filter 330.

PLL circuitry 300 has a test mode which is similar to that of conventional PLL circuitry 100, except that it has three sub-modes instead of two. Two of these modes operate identically to the test sub-modes in the conventional circuitry. In these sub-modes, one of the bits of the TEST signal will be 1, while the other will be 0. Consequently, the output of AND gate 380 will be 0, causing multiplexer 370 to select the charge pump output to be passed to low-pass filter 330. As in the conventional circuitry, phase and frequency detector 310 receives the bits of the TEST signal and, in these sub-modes, continuously asserts either the UP control signal or the DN control signal. These control signals drive charge pump 320 to produce a minimum or maximum voltage at its output, which is then provided to low-pass filter 330.

In the third test sub-mode of PLL circuitry 300, both bits of the TEST signal are 1. In this sub-mode, the output of AND gate 380 is 1, which is input to multiplexer 370, causing the multiplexer to select the RCLK input. The RCLK signal is provided to low-pass filter 330, and the resulting output of the filter is provided as control voltage VC to VCO 340. Because control voltage VC is simply the integral of RCLK, the user can adjust RCLK to control the voltage (VC) which is provided to VCO 340. Consequently, the user can determine the frequency of the VCO output as a function of input voltage, instead of only being able to determine the minimum and maximum frequencies, as in the prior art. The measurement of the linearity of the VCO response (i.e., the VCO output frequency as a function of input voltage) will be discussed in more detail below.

Figure 4:
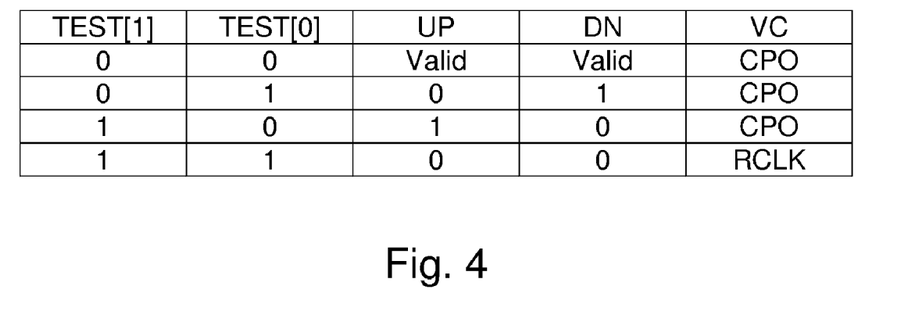
FIG. 4 is a table showing the values of the TEST signal and the resulting control signals UP, DN and VC in the embodiment of FIG. 3.

Referring to FIG. 4, a table showing the values of the TEST signal and the resulting control signals UP, DN and VC in the embodiment of FIG. 3A is provided. In the normal operating mode of the PLL, both bits of TEST are 0. In this mode, phase and frequency detector 310 generates control signals UP and DN which are "valid," causing charge pump 320 to generate a binary signal which is selected by multiplexer 370 and integrated by low-pass filter 330. The VCO control voltage VC is therefore the integral of CPO, as shown in the table. This causes VCO 340 to produce PCLK at a frequency and phase which drive FCLK toward RCLK.

In the test mode, one or both of the bits of TEST are 1. In the first test sub-mode, TEST[1] is 0 and TEST[0] is 1, causing UP to be deasserted (0) and DN to be asserted (1). The charge pump output (CPO) is again selected by multiplexer 370, so VC is the integral of CPO, which in this sub-mode is a constant low voltage. In the second test sub-mode, TEST[1] is 1 and TEST[0] is 0, causing UP to be asserted (1) and DN to be deasserted (0). The charge pump output is selected by multiplexer 370, so VC is the integral of CPO, which in this sub-mode is a constant high voltage. In the third test sub-mode, both TEST[1] and TEST[0] are 1, causing multiplexer 370 to select the RCLK input. VC is therefore the integral of RCLK, which can be varied by the user.

Figure 3B:
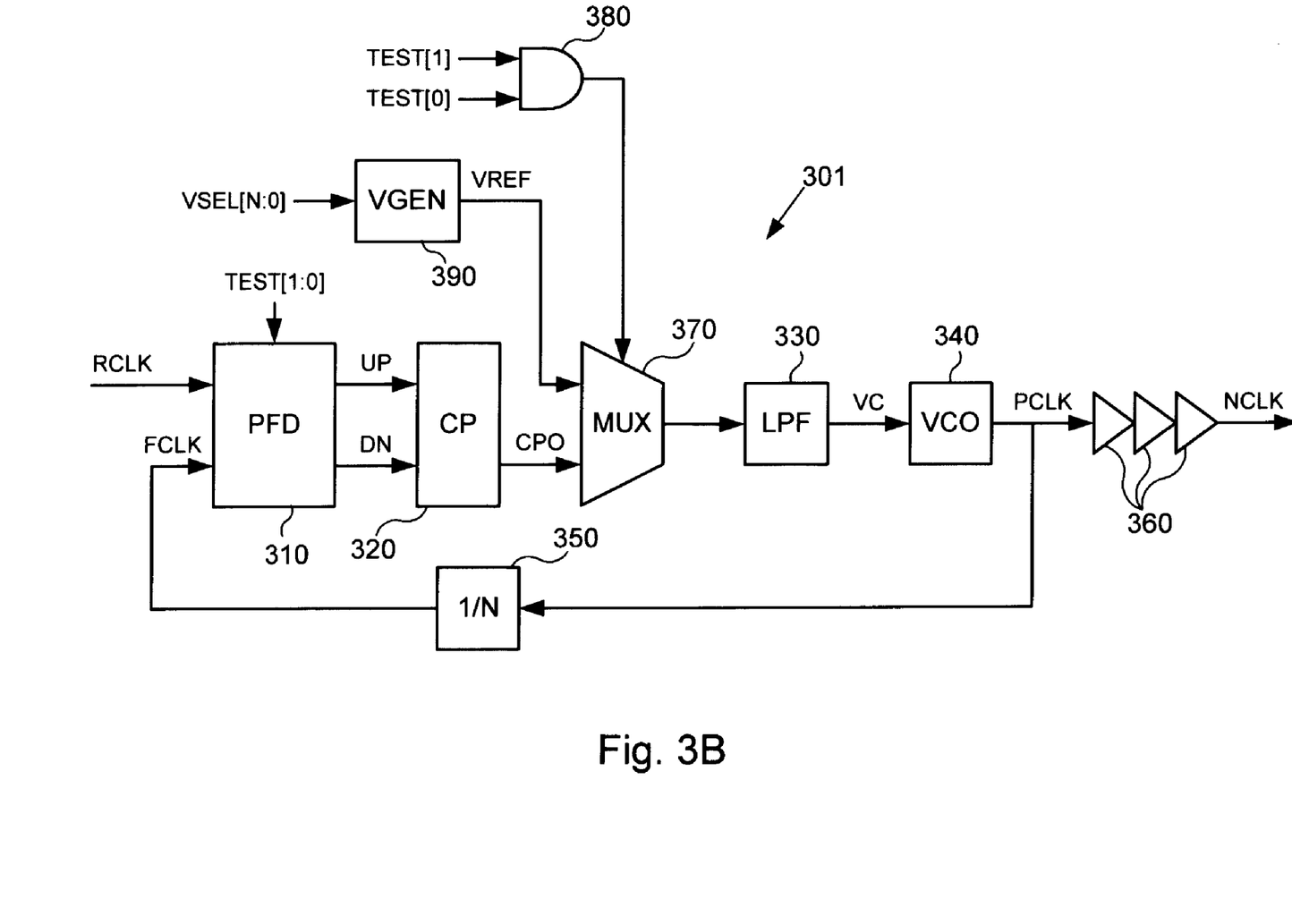

In the embodiment of FIG. 3A, RCLK is changeable by a user to set control voltage VC to desired values. RCLK may, for example, be a clock signal having a particular frequency. In one embodiment, the user may adjust VC by adjusting the duty cycle of RCLK while maintaining the frequency and amplitude of the signal. Alternatively, the user may vary the amplitude of the signal while maintaining the frequency and duty cycle. It should be noted that, in alternative embodiments, other types of signals may be provided to multiplexer 370 in place of RCLK. For instance, the signal may be a constant, user-selectable voltage. FIG. 3B is a functional block diagram illustrating the structure of an alternative embodiment of a PLL circuit 301 that employs a voltage generator 390 to produce a user-selectable voltage. Voltage generator 390 receives a select signal (VSEL) and generates a corresponding output voltage VREF. Voltage generator 390 could, for example, be a voltage divider circuit such as the one shown in FIG. 5.

Figure 5:
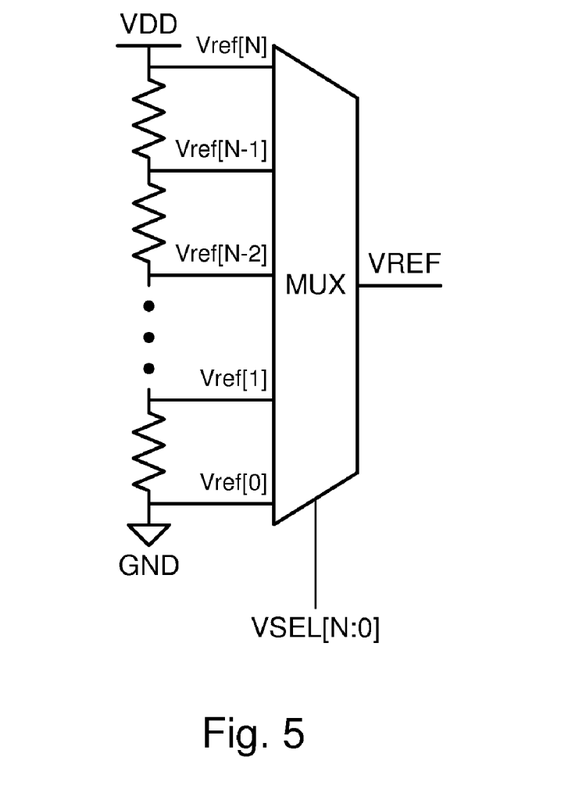
FIG. 5 is a diagram illustrating a voltage divider circuit configured to generate a reference voltage in accordance with one embodiment.

Referring to FIG. 5, a diagram illustrating the structure of a simple voltage divider circuit is shown. In this circuit, a set of resistors 511-513 is placed in series between VDD and ground. Voltage drops across the resistors provide a number of intermediate voltages (between VDD and ground) at the nodes between the resistors. These nodes are connected to the inputs of multiplexer 520. In this particular embodiment, ground and VDD are also provided as inputs to the multiplexer, although this would not be necessary in a PLL circuit as illustrated in FIG. 3B because it would be redundant with respect to the first two test sub-modes. A control signal VSEL[N:0] is also input to multiplexer 520 to control selection of one of the voltages to be output by the multiplexer as VREF. VREF would then be provided to multiplexer 370 in place of RCLK. It should be noted that multiplexer 370 in this embodiment is an analog multiplexer, since the reference voltage provided to it in the third test mode may be between ground and VDD.

Figure 6:
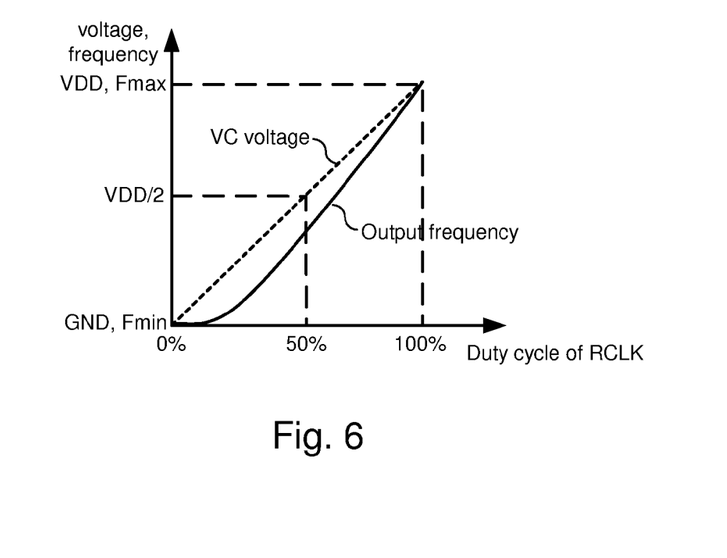
FIG. 6 is an exemplary plot of VCO output frequency as a function of input voltage.

As noted above, PLL circuit 300 has a test mode in which voltages intermediate to the minimum (ground) and maximum (VDD) voltages output by charge pump 320 can be applied to VCO 340. Each of these intermediate voltages causes VCO 340 to generate its output signal at a corresponding frequency. By applying the different voltages and measuring the corresponding output signal frequencies, the response of the VCO (i.e., the frequency versus input voltage) can be determined. An exemplary plot of VCO output frequency as a function of input voltage is shown in FIG. 6. It can be seen in this figure that the response curve of the VCO is not linear, but instead deviates from a linear response (which is depicted by the dotted line in the figure.) Determining the frequency response of the VCO may also be referred to as determining the linearity of the VCO.

It should be noted that the horizontal axis of the graph of FIG. 6 is labeled as the duty cycle of RCLK. As explained above, when PLL circuit 300 is operated in the intermediate frequency test sub-mode, VC is generated by integrating RCLK. If the excursions of RCLK go from ground to VDD, VC will have a value which the duty cycle of RCLK times VDD. Thus, if the duty cycle of RCLK is 10%, VC will be 10% of VDD. If the duty cycle of RCLK is 50%, VC will be VDD/2. The duty cycle is used in FIG. 6 because this curve can be used to determine the duty cycle of the PLL output signal (NCLK,) as will be explained in more detail below.

Figure 7A:
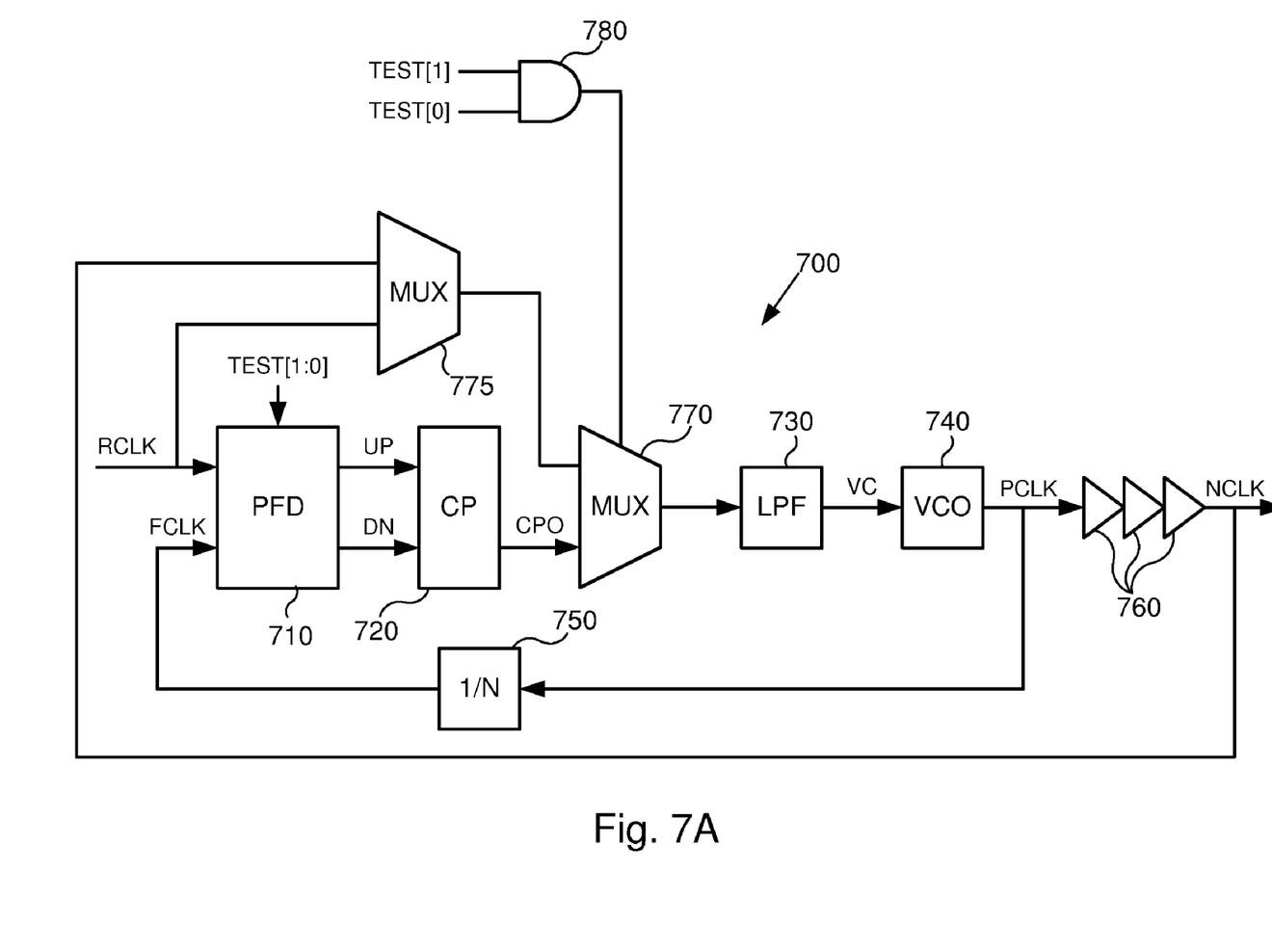
FIGS. 7A and 7B, are diagrams illustrating a PLL circuit in accordance with an alternative embodiment.

Referring to FIG. 7A, a diagram illustrating an alternative embodiment of a PLL circuit is shown. This embodiment builds upon the structure illustrated in FIG. 3, but adds a second multiplexer upstream from the first multiplexer in order to allow either the reference voltage (RCLK or VREF) or the PLL output signal (NCLK) to be fed through the low-pass filter to the VCO.

The structure of PLL circuit 700 is almost identical to the structure of PLL circuit 300 except for the addition of multiplexer 775. PLL circuit 700 includes a phase and frequency detector 710, charge pump 720, low-pass filter 730, VCO 740, frequency divider 750 buffers 760, multiplexer 770 and AND gate 780. PLL circuit 700 also includes a second multiplexer 775. The output of multiplexer 775 is input to multiplexer 770 in place of the line that provides RCLK to phase and frequency detector 710. RCLK is instead input to multiplexer 775. A line is also coupled between multiplexer 775 and the output of the PLL circuit so that PLL output signal NCLK is provided as an input to multiplexer 775.

PLL circuit 700 has a normal operating mode as described above in connection with the other PLL circuits. In this normal operating mode, both bits of TEST[1:0] are 0, so multiplexer 770 passes the output of charge pump 720 through low-pass filter 730 to produce control signal VC. Phase and frequency detector 710 again serves to detect differences between RCLK and FCLK, and to generate control signals UP and DN to drive the phase and frequency of FCLK to RCLK. In addition to the normal operating mode, PLL circuit 700 has test sub-modes as described above, including a minimum frequency test mode (TEST[1:0]={0,1}), a maximum frequency test mode (TEST[1:0]={1,0}) and an intermediate frequency test mode (TEST[1:0]={1,1}).

PLL circuit 700 also has a fourth test sub-mode which is controlled by a third bit in the TEST signal (i.e., TEST[2].) In the three previous test sub-modes, bit TEST[2] is 0. In the fourth test sub-mode (the PLL output test mode,) all three bits of the TEST signal are (i.e. TEST[2:0]={1,1,1}.) Bit TEST[2] is input only to multiplexer 775. The bit determines whether multiplexer 775 selects the user-variable signal RCLK, or the output (NCLK) of the PLL circuit itself. In the first three test sub-modes (minimum frequency, maximum frequency and intermediate frequency,) TEST[2] is 0, and multiplexer 775 selects RCLK. In the fourth test sub-mode (PLL output test,) TEST[2] is 0, so multiplexer 775 selects NCLK. Control signal VC is therefore dependent upon the duty cycle of NCLK. Consequently, the frequency of PLL output signal NCLK is dependent upon its own duty cycle. Because the linearity of the VCO response is known (assuming it has been determined using the intermediate frequency test sub-mode,) the duty cycle of PLL output signal NCLK can be determined from a measurement of its frequency.

Figure 8:
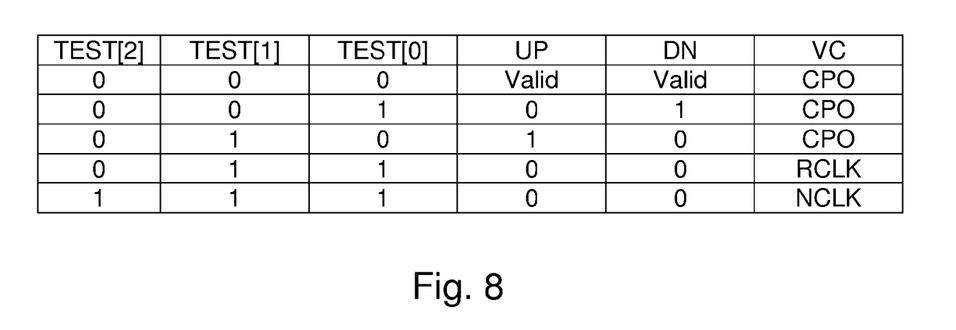
FIG. 8 is a table containing the values of the three-bit TEST signal and the resulting control signals UP, DN and VC in the embodiment of FIG. 7A.

Referring to FIG. 8, a table containing the values of the three-bit TEST signal and the resulting control signals UP, DN and VC in the embodiment of FIG. 7A is shown. In the normal operating mode, all three bits of TEST are 0, causing the "valid" control signals to drive charge pump 720, which in turn causes VC to have a value that drives FCLK toward RCLK. In the minimum frequency test sub-mode, TEST[2:0] is {0,0,1}, causing DN to be continuously asserted, driving the output of charge pump 720 to ground and causing VCO 740 to produce an output signal having a minimum frequency. In the maximum frequency test sub-mode, TEST[2:0] is {0,1,0}, causing UP to be continuously asserted, driving the output of charge pump 720 to VDD and causing VCO 740 to produce an output signal having a maximum frequency. In the intermediate frequency test sub-mode, TEST[2:0] is {0,1,1}, causing RCLK to be passed to low-pass filter 730 to produce VC. In the PLL output test sub-mode, TEST[2:0] is {1,1,1}, causing NCLK to be passed to low-pass filter 730 to produce VC.

Figure 7B:
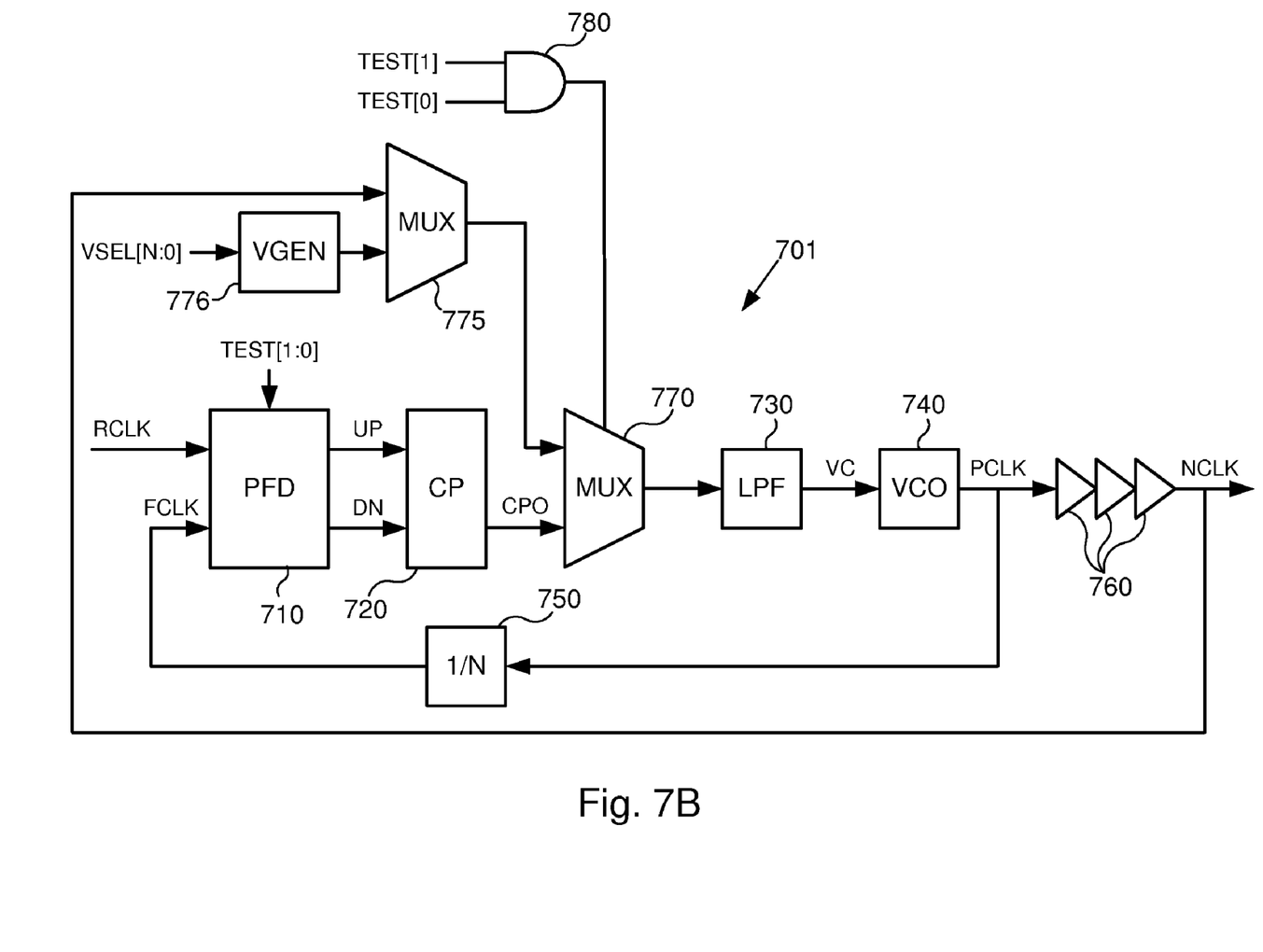

As noted above with respect to PLL circuit 300, the RCLK input to multiplexer 775 can be replaced by a different user-variable signal for purposes of the intermediate frequency test sub-mode. For instance, a voltage divider such as the one illustrated in FIG. 5 can be provided, and the output of the voltage divider (VREF) can be input to multiplexer 775 in place of RCLK. The NCLK input to multiplexer 775 would remain unchanged. Referring to FIG. 7B, a functional block diagram illustrating a PLL circuit 701 incorporating such a reference voltage generator is shown. As noted above, reference voltage generator 776 is coupled to multiplexer 775 to provide reference voltage VREF to the multiplexer in place of RCLK.

Figure 9A:
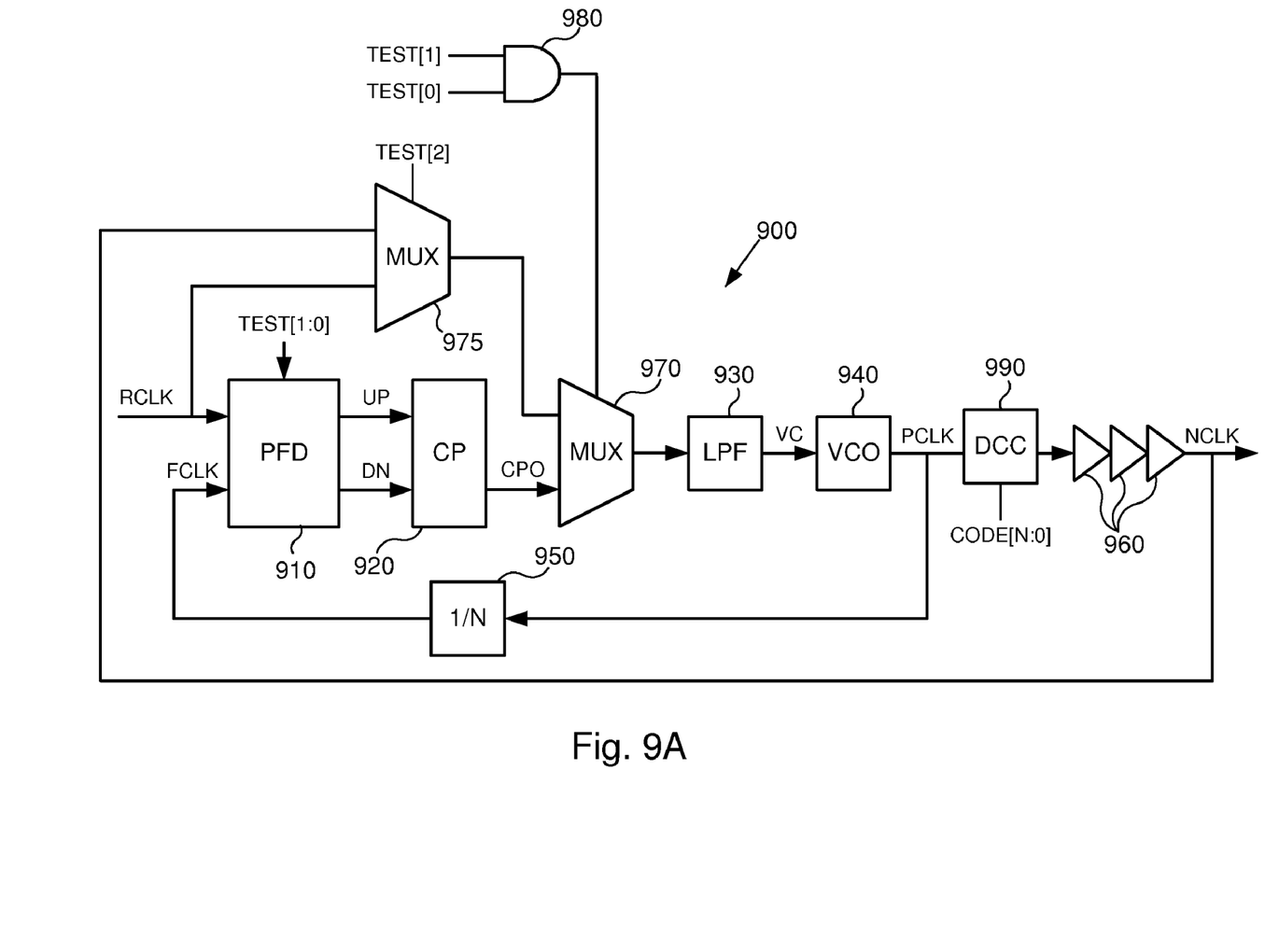
FIGS. 9A and 9B are functional block diagrams illustrating another alternative embodiment of a PLL circuit.

Referring to FIG. 9A, a functional block diagram illustrating another alternative embodiment of a PLL circuit is shown. The embodiment of FIG. 9A includes the structure illustrated in FIG. 7A, but adds a duty cycle correction unit prior to the output buffers in order to correct the duty cycle of the signal output by the PLL circuit.

The structure of PLL circuit 900 is identical to the structure of PLL circuit 600, except that a duty cycle correction unit 990. PLL circuit 900 includes a phase and frequency detector 910, a charge pump 920, a low-pass filter 930, a VCO 940, a frequency divider 950, and buffers 960. PLL circuit 900 also includes first multiplexer 970, second multiplexer 975 and AND gate 980. Duty cycle correction unit 990 is inserted between VCO 940 and output buffers 960.

Figure 9B:
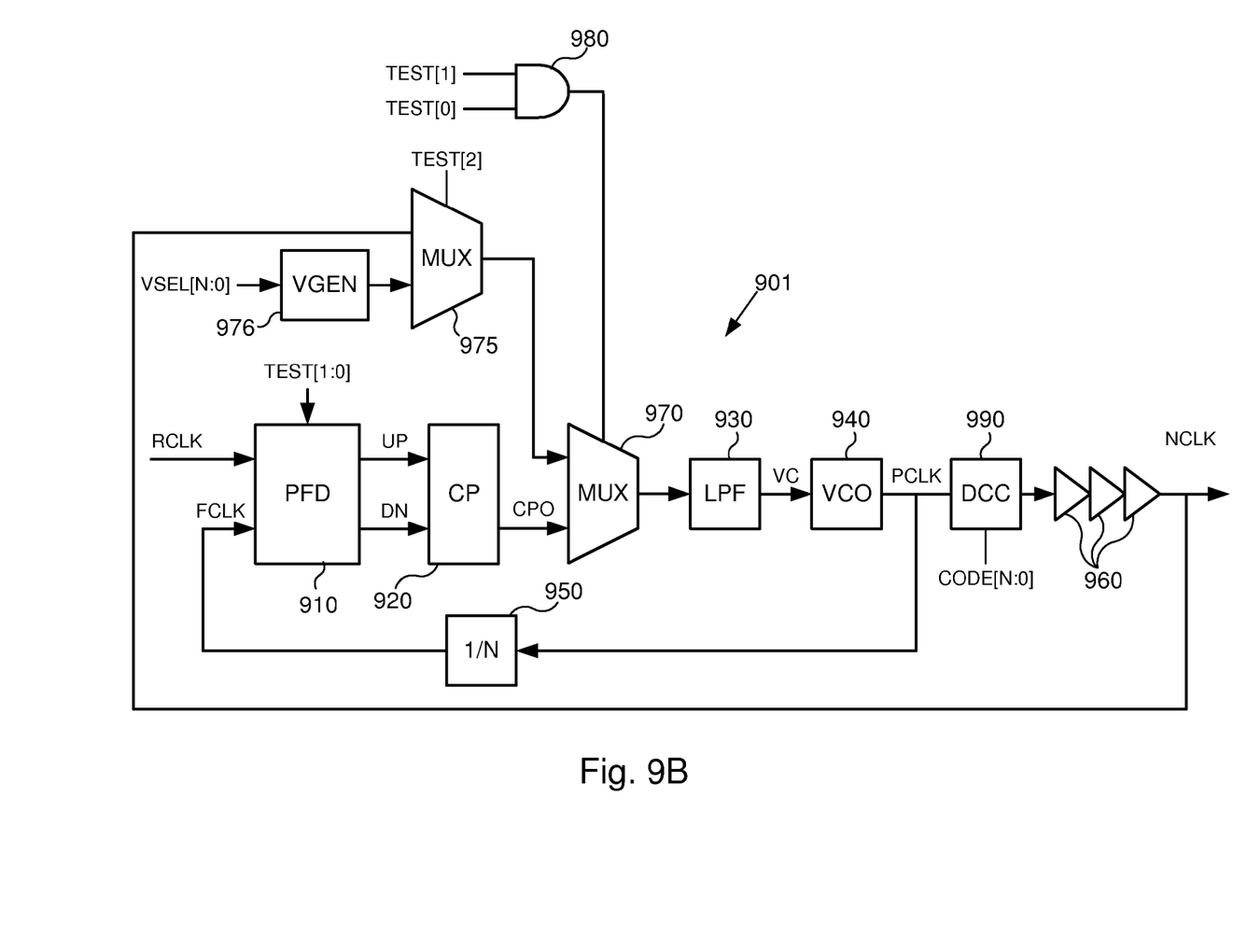

As with the embodiments of the PLL circuits described above, the RCLK input to multiplexer 975 can be replaced by a different user-variable signal for purposes of the intermediate frequency test sub-mode. Again, a voltage divider such as the one illustrated in FIG. 5 can be provided, and the output of the voltage divider (VREF) can be input to multiplexer 975 in place of RCLK as shown in FIG. 9B. FIG. 9B is a functional block diagram illustrating a PLL circuit 901 incorporating a reference voltage generator. The NCLK input to multiplexer 975 remains unchanged.

PLL circuit 900 has a normal operating mode and several test sub-modes. These modes are exactly the same as described above with respect to PLL circuit 600. The test sub-modes therefore include a minimum frequency sub-mode, a maximum frequency sub-mode, an intermediate frequency sub-mode, and a PLL output test sub-mode. As explained above, the first of these three sub-modes are used to measure the VCO frequency response and to determine its linearity. The fourth sub-mode is used to determine the PLL output frequency associated with the PLL output duty cycle. Once the duty cycle of the PLL output signal has been determined, it can be corrected (i.e., changed to 50%) by applying an appropriate input signal (CODE[N:0]) to duty cycle correction unit 990.

Each of the embodiments described above has progressively more features. PLL circuit 300 not only operates in a normal mode, but also enables measurement of the linearity or frequency response of the VCO in the circuit. PLL circuit 700 further enables application of the integrated (low-pass filtered) PLL output to the VCO so that the duty cycle of the PLL output can be determined (based on the measured VCO frequency response.) Finally, PLL circuit 900 adds the feature of correcting the duty cycle of the PLL output after the initial duty cycle has been determined. This progression of features in the described PLL circuits characterizes an alternative embodiment which is a method for correcting the duty cycle of a PLL circuit. This method can be implemented, for example, in PLL circuit 900, which is depicted in FIG. 9A. The method can be summarized as including the steps of: determining the frequency response of the PLL's VCO; determining the VCO frequency when the VCO input is based upon the PLL output; and correcting the duty cycle of the PLL output based on the measured PLL output duty cycle.

Figure 10:
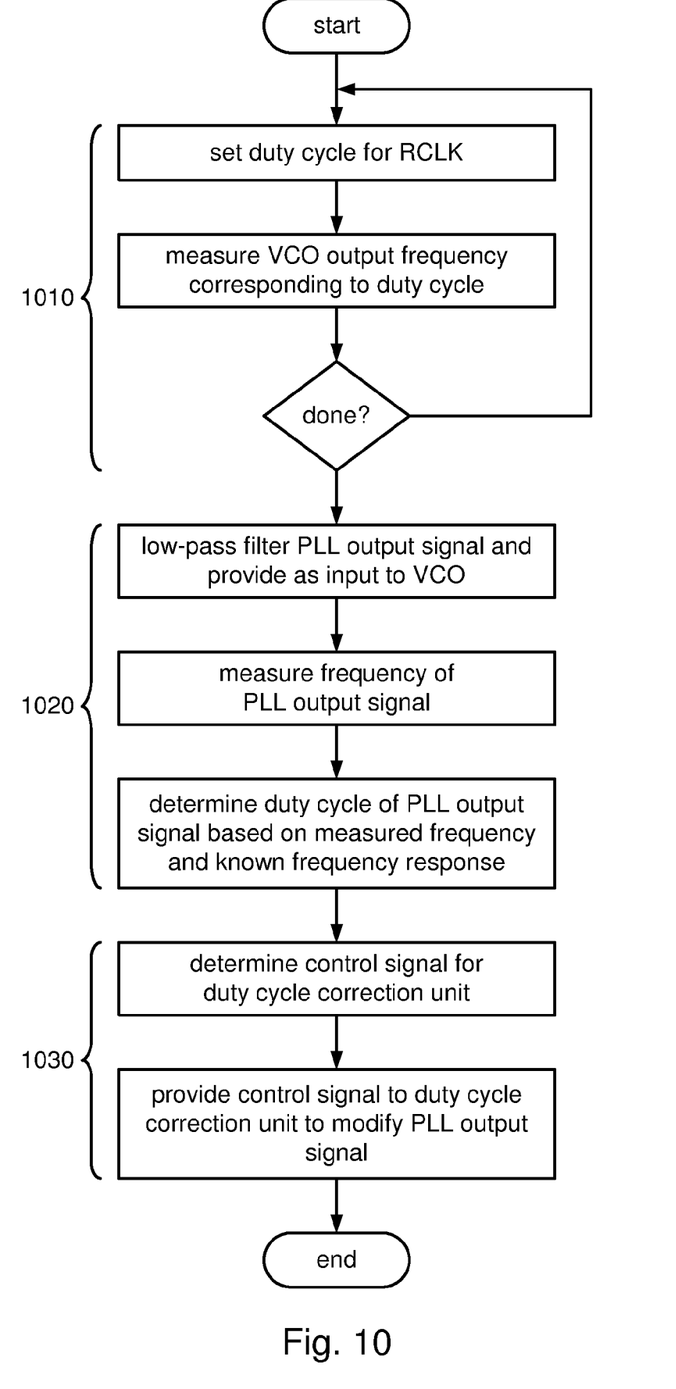
FIG. 10 is a flow diagram illustrating a method in accordance with one embodiment of the invention.

Referring to FIG. 10, a flow diagram illustrating a method in accordance with one embodiment of the invention is shown. In this embodiment, the method begins with determination of the VCO's frequency response (1010.) This will involve using one or more of the test sub-modes to determine the frequencies produced by the VCO when the VC signal input to the VCO has values ranging from a minimum voltage (e.g., ground) to a maximum voltage (e.g., VDD.) The minimum and maximum voltages/frequencies can be determined using the conventional test sub-modes, while the intermediate voltages/frequencies can be determined using the intermediate frequency test sub-mode. As explained above, VC can be varied by passing the RCLK signal through the low-pass filter to the VCO and changing the duty cycle of RCLK. For each duty cycle value, the frequency of the signal generated by the VCO is recorded, and a resulting plot of frequency versus duty cycle (or voltage) can be generated.

After the frequency response of the VCO has been determined, the duty cycle of the PLL output signal (without duty cycle correction) is determined (1020.) This involves low-pass filtering the PLL output signal (to convert the signal into a relatively constant voltage) and applying it as a control voltage to the VCO. The frequency of the PLL output signal that is generated based upon this input is then measured. Because the frequency response of the VCO as a function of duty cycle is known, the duty cycle corresponding to the measured frequency can be determined.

When the uncorrected duty cycle of the PLL output signal has been determined, the duty cycle can be corrected (1030.) In this embodiment, "correcting" the duty cycle means causing the duty cycle to be about 50%. It should be noted that various conventional methods can be used to achieve this duty cycle correction, so they will not be described in detail here. It will simply be noted that, upon providing an appropriate control signal to a duty cycle correction unit, a signal which does not have a 50% duty cycle can be input to the unit (e.g., PCLK) and corrected, so that a resulting signal output from the unit (e.g., NCLK) will have a duty cycle of approximately 50%.

It should be noted that the method described above may be implemented with or without human intervention. A person can perform the steps, or the steps can all be performed in hardware, with the results of each step (e.g., frequency response) stored in registers or other memories.

Those of skill in the art will understand that information and signals may be represented using any of a variety of different technologies and techniques. For example, data, information, signals, bits and symbols that may be referenced throughout the above description may be represented by voltages, currents, electromagnetic waves, magnetic or optical fields, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs), application specific integrated circuits (ASICs), field programmable gate arrays (FPGAs) or other programmable logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
    a phase locked loop (PLL) circuit including a voltage controlled oscillator (VCO);
    a phase and frequency detector configured to detect phase and frequency differences between a reference signal and a feedback signal that varies in dependence upon a VCO output signal;
    a charge pump configured to receive charge pump control signals from the phase and frequency detector and to produce a charge pump output signal, wherein the charge pump output signal is output as a first control signal; and
    a multiplexer configured to alternately select a second control signal from the first control signal that varies in dependence on the output of the phase and frequency detector and a test signal that is variable by a user, wherein the multiplexer is further configured to provide the selected control signal as an input to the VCO.

2. The system of claim 1, wherein the reference signal input to the phase and frequency detector is input to the first multiplexer as the test signal.

3. The system of claim 1, further comprising:
    a frequency divider configured to receive the VCO output signal, divide the frequency of the VCO output signal by a value N, and provide a resulting frequency-divided signal to the phase and frequency detector as the feedback signal; and
    a low-pass filter configured to filter the selected control signal before the selected control signal is provided as the input to the VCO.

4. The system of claim 1, further comprising a voltage generator configured to generate the test signal according to a selecting signal.

* * * * *